United States Patent [19]

Funari et al.

[11] Patent Number: 5,109,318

[45] Date of Patent: Apr. 28, 1992

[54] PLUGGABLE ELECTRONIC CIRCUIT PACKAGE ASSEMBLY WITH SNAP TOGETHER HEAT SINK HOUSING

[75] Inventors: Joseph Funari, Vestal; Terence C. Godown; Scott D. Reynolds, both of Endwell; Bahgat G. Sammakia, Johnson City, all of N.Y.

[73] Assignee: International Business Machines Corporation, Armonk, N.Y.

[21] Appl. No.: 520,011

[22] Filed: May 7, 1990

[51] Int. Cl.⁵ .................. H05K 7/20; H01L 23/40
[52] U.S. Cl. .................................. 361/388; 361/386; 357/81
[58] Field of Search .............. 357/81, 74; 361/379, 361/413, 386, 388

[56] References Cited

U.S. PATENT DOCUMENTS

| | | | |
|---|---|---|---|
| 3,506,877 | 4/1970 | Owen | 317/100 |
| 4,092,697 | 5/1978 | Spaight | 361/386 |
| 4,415,025 | 11/1983 | Horvath | 165/185 |
| 4,444,994 | 4/1984 | Baker et al. | 174/16 |
| 4,546,410 | 10/1985 | Kaufman | 361/387 |
| 4,563,725 | 1/1986 | Kirby | 361/338 |
| 4,707,726 | 11/1987 | Tinder | 357/81 |
| 4,716,494 | 12/1987 | Bright et al. | 361/386 |
| 4,716,498 | 12/1987 | Ellis | 361/386 |
| 4,756,081 | 7/1988 | Penn | 357/81 |
| 4,774,632 | 9/1988 | Neugebauer | 361/386 |
| 4,888,637 | 12/1989 | Sway-Tin et al. | 357/81 |
| 4,896,168 | 1/1990 | Newman et al. | 357/81 |

FOREIGN PATENT DOCUMENTS

| | | |
|---|---|---|
| 0845346 | 6/1970 | Canada . |
| 8611365 | 9/1960 | European Pat. Off. . |
| 58-101447 | 6/1983 | Japan .................. 357/81 |
| 60-198848 | 10/1985 | Japan .................. 357/81 |
| 1-59842 | 3/1989 | Japan .................. 357/81 |

OTHER PUBLICATIONS

"Micro-Edge SIMM Connectors"–Technical Document Product Specification, No. 108-1095, AMP, Inc., Catalog 87-801, Issued Sep. 1987.

Primary Examiner—Andrew J. James
Assistant Examiner—Viet Q. Nguyen
Attorney, Agent, or Firm—Norman R. Bardales

[57] ABSTRACT

A pluggable electronic circuit package assembly for use with an edge type connector has a two piece heat sink housing. The heat sink housing has internal retention posts and internal posts receiving recesses that allow the two pieces to be snap fit together for easy assembly and disassembly. Also, a resilient latches the connector to the assembly. In one embodiment, the latch latches the connector to the assembly's printed circuit substrate, the edge of which substrate plugs into the connector. In other embodiments, the latch latches the connector to the assembly's heat sink housing. Also, in one embodiment, the latch is demountable and combined with an external clamp.

36 Claims, 5 Drawing Sheets

PLUGGABLE ELECTRONIC CIRCUIT PACKAGE ASSEMBLY WITH SNAP TOGETHER HEAT SINK HOUSING

BACKGROUND OF THE INVENTION

1. Field of the Invention

This invention relates to pluggable electronic circuit package assemblies and more particularly to pluggable electronic circuit package assemblies for edge type connectors and the like, and as well as to heat sink housings per se of such assemblies.

2. Description of the Prior Art

Electronic circuit package assemblies can be categorized into pluggable and non-pluggable types. With regards to pluggable circuit package assemblies, these may be further categorized into edge connector types and non-edge connector types.

Examples of non-pluggable types are described in U.S. Pat. Nos. 4,444,994, 4,546,410, 4,563,725, and 4,774,632.

Briefly, the assembly of U.S. Pat. No. 4,444,994, has a quick disconnect finned heat sink which has as a part thereof a mounting plate for mounting electrical components requiring cooling. An electrical terminal block is affixed to the sink and provides common connection points for connecting the wires of the mounted electrical component and the wires of the remote peripheral control circuitry for operating the mounted component.

In the assembly of U.S. Pat. No. 4,546,410, an electrical circuit package has an electrically insulating housing that is mounted to a finned heat sink with screws. The heat generating electrical component with its accompanying lead frame are housed in the opening of the housing and is mounted on the top side of an electrically insulative thermally conductive substrate which is part of the circuit package. A rupturable membrane containing thermal grease is positioned between the substrate and the heat sink and is ruptured during assembly of the circuit package to the heat sink when the membrane becomes compressed between the substrate and the heat sink.

Top and bottom thermal plates are used in the package assembly of U.S. Pat. No. 4,563,725. The input/output (I/O) terminals of the circuit components, i.e. semiconductor chip carriers having an integrated circuit (IC) chip encased or bonded thereto, are bonded to a circuitized polyimide flexible substrate and the two are sandwiched between the two thermal plates. Inwardly projecting studs or pillars are formed on the bottom plate and pass thru aligned apertures in the circuitized tape to make contact with the components. The top plate is directly in contact with the component or alternatively may have individual inwardly projecting resilient means making contact with the components. Resilient U-shaped clamps, or alternatively bolts, engage the outer surfaces of the thermal plates to keep the assembly together.

In one of the IC chip packages of U.S. Pat. No. 4,474,632, two identical hermetically sealed chip holding assemblies are mounted on opposite sides of a silicon interconnect module. The latter has multiple interconnected conductor layers which interconnect I/O pads located on its two planar surfaces. Each chip holding assembly has outer and inner silicon plates separated by silicon spacers in which the chips are housed. The chip I/Os are solder bumps which are compressively mated with the conductor pads on the facing surface of the inner plate, the latter pads being connected by conductive vias of the inner plate to conductor pads located on the opposite surface of the inner plate. The last mentioned pads in turn mate with the I/O pads on the particular adjacent surface of the interconnect module, and may be solder bonded together or compliantly compressed together. In the chip holding assembly, copper gauze is inserted between the outer plate and the top of the chip so as to resiliently urge the pads of the chip to contact the adjacent pads of the inner plate. The external I/Os for the package are provided by pads located on the periphery of the interconnect module. In another package of this patent, the chip I/Os are placed in direct compressive contact with the interconnect module pads, the chips being located between a pair of spaced finned heat sink and copper gauze being inserted between the heat sink plates and the tops of the chips to resiliently urge the chips towards the interconnect module.

Examples of pluggable assemblies of the non-edge type are described in U.S. Pat. Nos. 3,506,877, 4,092,697, 4,415,025, 4,707,726, 4,716,494 and 4,716,498. Generally, in these types, IC chips are mounted to chip carrier substrates, which in turn are electrically connected to a printed circuit (PC) board or the like.

In the module assembly of U.S. Pat. No. 3,506,877, a metal header with a row of feed thru pins is adapted to be plugged into a standard companion connector. Mounted to the header is the flange formed at an edge of a heat sink shield plate. The pins of the header feed thru a row of openings in the flange and are electrically insulated from the flange and header by glass seals. Located between the row of pins and the heat sink is a PC board which has a surface bonded by a thermal conductive adhesive to the heat sink. Circuit components are mounted on the other surface of the board, the latter having a peripheral row of I/O pads that are affixed, e.g. by soldering, welding, etc., to the heads of the feed thru pins of the header. Another component populated PC board is similarly bonded to the other side of the heat sink shield plate.

In the assembly of U.S. Pat. No. 4,707,726, the three external electrode conductors of an encapsulated discrete power transistor protrude from one of its sides and are plugged into and soldered to appropriate conductive receiving holes of a PC board. On another of its sides, the discrete transistor is inserted into a channel formed on one surface of a heat sink. The heat sink has fins formed on its opposite surface. The transistor is maintained in contact with the walls of the channel of the heat sink by a spring beam plate.

U.S. Pat. Nos. 4,092,697, and 4,415,025 and 4,716,494 disclose circuit package assemblies in which the IC chip is bonded to a pinned substrate having an array of pins connected to the I/O terminals of the particular chip.

In the case of the assemblies of U.S. Pat. Nos. 4,092,697 and 4,415,025, the pinned substrate is a circuitized ceramic substrate having an the array of pins which in turn are adapted to be plugged into a corresponding array of conductive holes of a PC board. A finned heat sink is hermetically sealed to the substrate and encloses the chips.

In the case of the package assembly of U.S. Pat. No. 4,716,494, an IC chip is located in the recess of a pinned chip carrier having an array of pins that plug into a corresponding array of receptacles of a pinned electrical socket, the pins of the latter in turn being plugged into plated thru holes (PTHs) of a PC board. A bow-shaped spring clips a heat sink, which has circular stacked fins, to the housing of the socket.

U.S. Pat. No. 4,716,498 describes rack mounted electric circuit module assemblies which use pin connectors that plug into mating socket connectors mounted on a PC board secured to the rack. The pin connectors are part of the module assembly and have receptacles for receiving the pins of feed thru pin header, the heads of the pin headers being connected by discrete flying lead conductors or a flexible conductor tape to the circuitized substrate to which an IC carrier is connected.

Edge type connectors generally have one or more linear arrays of spring contacts mounted in housing or header. For single sided applications, the spring contact arrays are aligned in the same direction. For double sided applications, the spring contacts of one or more of the arrays are aligned in the same direction and the spring contacts of one or more of the other arrays are aligned in the opposite direction. The spring contacts are adapted to mate with the I/O pads of a PC card or board that are arranged in a corresponding linear array or arrays which are peripherally located on one (i.e. single sided) or both (double sided) surfaces of the board near a predetermined edge of the board.

By way of example, European Patent Application No. No. 86113669.6, published May 6, 1988, discloses a package assemble which is used with an edge type connector of the zero insertion force (ZIF) kind. In this assembly, circuit modules containing IC chips are mounted to one surface, referred to as the populated surface, of a PC card. The card is sandwiched in a cassette which has a molded plastic side cover adjacent to the unpopulated surface of the card and a metal heat sink cover adjacent to the populated surface of the card. Two opposite edges of the rectangular shaped card extend outwardly from the two cassette covers providing exposed extensions. Located on each extension is a linear array consisting of a pair of parallel rows of I/O pads, there being a pair on both the opposing surfaces of the card in proximity to each of the last two mentioned edges. Each such edge is associated with a ZIF connector. More particularly, when the two edges are inserted, i.e. plugged, into their respective associated ZIF connector, each of the two peripheral I/O pad arrays located on the opposite surfaces of the card extension associated with the particular edge are adapted to mate with a corresponding one of the linear arrays of opposing spring contacts of its respective associated ZIF connector. Deformable metal taps formed on the metal heat sink cover are inserted into openings in the plastic cover and are bent to affix the metal cover to the plastic one. For retaining the card and cassette in the connectors, a pair of resilient bow shaped elongated members are housed in a handle which is affixed to the plastic cover. The handle is actuated to plug the card into the connectors, causing a tip of each bow member resiliently to engage a pocket formed in the connector adjacent to it.

In the Technical Document Product Specification 108-1095, entitled "Micro-Edge SIMM Connectors", published by AMP Incorporated, there is shown a package assembly which includes a PC card with a row of single in line memory modules (SIMM) mounted to a surface of the card and with a row of I/O pads along one edge of the card. The I/O pads mate with a row of cam operated spring contacts mounted in an edge type connector when the edge of the card is plugged into the connector and the contacts are cammed to their closed position.

With the concurrent advances in the related technologies providing higher circuit densities of the individual chips per se, higher density input/output connections of the chips and/or cards, and/or higher wiring density and the decreased wiring dimensions and spacings of the conductors of the card, there is a need for improved circuit package assemblies for accommodating these advances that are highly reliable, relatively simple, easy to assemble/disassemble, and which have improved thermal and/or environmental enhancement characteristics, and which were heretofore not available in the prior art. With the advent of direct chip attach (DCA) technology, i.e. electrical and mechanical attachment of integrated circuit chips directly to an organic printed circuit card or the like, the need is even more acute.

SUMMARY OF THE INVENTION

An object of this invention is to provide an improved pluggable electronic circuit package assembly and a heat sink enclosure of such an assembly.

Another object of this invention is to provide a pluggable electronic circuit package assembly and heat sink enclosure for use with an edge type connector.

Another object of this invention is to provide an electronic circuit package assembly and heat sink enclosure of the aforementioned kind which has improved thermal and/or environmental protective enhancement characteristics.

Another object of this invention is to provide an electronic circuit package assembly and heat sink enclosure of the aforementioned kind for DCA configurations.

Still another object of this invention is to provide an electronic circuit package assembly and heat sink enclosure of the aforementioned kind that is readily assembled and/or disassembled, that is compact, modular, simple and/or inexpensive.

According to one aspect of the invention, a pluggable electronic circuit package assembly, which is pluggable into an edge type connector, is provided with a heat sink enclosure; and according to still another aspect of the invention there is provided a heat sink enclosure means of such an assembly.

More particularly, the assembly has a planar printed circuit substrate with a rectangular configuration. First and second predetermined circuit patterns are on the first and second parallel major outer surfaces, respectively, of the substrate and are interconnected by conductive means in the substrate. The substrate has three regions. The first region includes therein a portion of at least the first circuit pattern, the last mentioned portion having at least one row of input/output printed circuit terminals in substantial parallel alignment with and located in substantial proximity to a predetermined edge of the substrate. This predetermined edge and these input/output printed circuit terminals are pluggable into a compatible edge type connector for connection thereto. At least one first row of first integrated circuit chip means is mounted on the first major surface and these chip means are connected to the first circuit pattern. At least one second row of second integrated circuit chip means is mounted on the second major surface and these chip means are connected to the second circuit pattern. The mounted first and second chip means have a predetermined first height profile, and the rows of mounted chip means are in substantial parallel alignment with the aforesaid predetermined edge. These mounted chip means are located in a second region of the substrate. At least one row of circuit components is mounted on at least one of the major surfaces and these components are connected to the particular one of the circuit patterns on the particular major surface on which these circuit components are mounted. The mounted circuit components have a predetermined second height profile which is larger than the first height profile. The row of circuit components is also in substantial parallel alignment with the aforementioned predetermined edge, and these circuit components are located in a third region of the substrate. Heat sink housing means with substantially two identical first and second members in an abutting facing relationship are provided and define an enclosure. More particularly, the enclosure encloses the second and third regions of the substrate and the mounted chip means and the circuit components located respectively in the second and third regions. The first region and the aforementioned predetermined edge extend outwardly from the enclosure. The assembly has retention means for retaining the first and second members together and the substrate in registration with the enclosure defined thereby.

The foregoing and other objects, features and advantages of the invention will be apparent from the more particular description of the preferred embodiments of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENTS

Referring to FIGS. 1–6, there is shown a preferred embodiment of the electronic circuit package assembly and of the heat sink housing. More particularly, the electronic circuit package assembly is generally indicated by the reference number 1. It has a planar printed circuit substrate 2, e.g. a printed circuit board or card, with a rectangular-like configuration. The side of substrate 2, as viewed facing FIG. 1, has a major outer surface 2A on which is disposed a circuit pattern of printed circuit conductors, the details of which (except for the terminals 3 hereinafter described) are omitted in the Figures for sake of clarity. In the embodiment of FIGS. 1–6, it should be understood that on the opposite side of substrate 2 there is also another printed circuit conductor pattern, not shown, disposed on the substrate's other major outer surface 2B, cf. FIGS. 5 and 6, wherein the substrate 2 is shown in outline form for sake of explanation and clarity. The two circuit patterns are interconnected by conductive means, not shown, such as, for example, conductive vias or plated through holes in the substrate 2. The circuit pattern on surface 2A has a row of input/output printed circuit terminals 3 that are in substantial parallel alignment with and located in substantial proximity to the edge 4 of substrate 2. The edge 4 and the terminals 3 are pluggable into a compatible edge type connector 5, which is schematically shown in exploded view in FIG. 2, for connection thereto. The partially shown therein connector 5, for use with the embodiment of FIGS. 1–6, may be of the type described in the aforementioned Technical Document Product Specification 108-1095 published by AMP Inc. If desired, edge 4 may be beveled to facilitate insertion of the substrate 2 into the connector 5. In addition, substrate 2 may have, if desired, one or more internal layers of printed circuit patterns, if desired. The left upper corner of substrate 2 is polarized with a notch 2N which coacts with a complementary member, not shown, in connector 5 that prevents incorrect insertion of the substrate into the connector 5.

Plural integrated circuit chip devices 6 are mounted in a row to the surface 2A. Preferably, the devices 6 are IC chips which have an array of I/O terminals, not shown, on their respective active planar surface, which as viewed facing FIG. 1, faces surface 2A of substrate 2. Beneath each device 6, the circuit pattern of surface 2A has a corresponding array of I/O PC pads, not shown, in registration with and connected by direct chip attachment (DCA) bonding to the I/O terminals of the particular device 6 superimposed above the I/O pad array. Alternatively, the devices 6 may be IC chip carrying components, each of which has one or more IC chips mounted to and electrically connected to the connectors of a suitable carrier, such as for example encased IC chip modules and the like, the I/O terminals of the carrier being connected to appropriate I/O pads, not shown, of the circuit pattern of surface 2A, in a manner well known to those skilled in the art.

Figure 6:
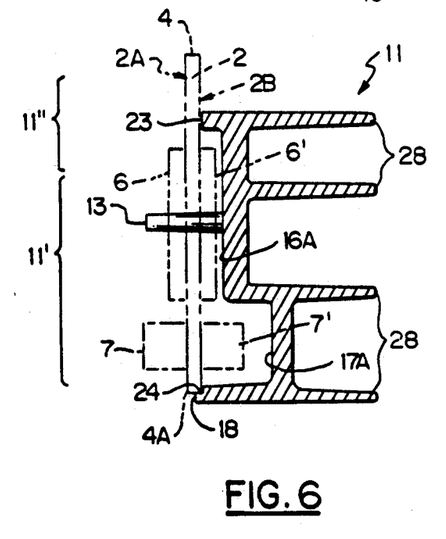

In a similar manner, plural integrated circuit chip devices 6', one of which is shown in outline form in FIG. 6, are mounted in a row on the aforementioned opposite surface 2B of substrate 2, and are connected to the aforementioned circuit pattern, not shown, of the surface 2B. Preferably, the row of devices 6 mounted on surface 2A and the row of devices 6' mounted on the opposite surface 2B are in coextensive alignment and both rows are in substantial parallel alignment with the elongated edge 4 of the substrate 2; and preferably the devices 6 and 6' are of the same type. Moreover, the devices 6 mounted to surface 2A and their counterparts 6', i.e. the devices 6' mounted on the surface 2B, have predetermined identical uniform height profiles normal to the surfaces 2A and 2B, respectively, of substrate 2.

Plural circuit components 7 are also mounted in a row on surface 2A. The terminals, not shown, of components 7 are connected to appropriate PC pads, not shown, of the circuit pattern of surface 2A. Components 7 may be active and/or passive components such as, for example, other IC devices, capacitors, resistors, etc., and any combinations thereof. In the embodiment shown in FIG. 1, the components 7 are preferably discrete capacitors, which are identically configured.

In a similar manner, plural components 7', one of which is shown in outline form in FIG. 6, are mounted in a row on surface 2B and are like or, alternatively, identical to the components 7 and are connected to the circuit pattern, not shown, on surface 2B. Preferably, the row of components 7 mounted on surface 2A and the row of their counterparts 7' mounted on the opposite surface 2B are in coextensive alignment, and both rows are in substantial parallel alignment with the elongated edge 4 of substrate 2. Moreover, the components 7 and their counterparts 7' have a predetermined second height profiles normal to the surfaces 2A and 2B, respectively, of substrate 2 to which they are mounted that are larger than the height profile of the devices 6 and the devices 6', respectively. In the embodiment being described, the height profiles of the components 7 and 7' are identical and uniform.

Figure 1:
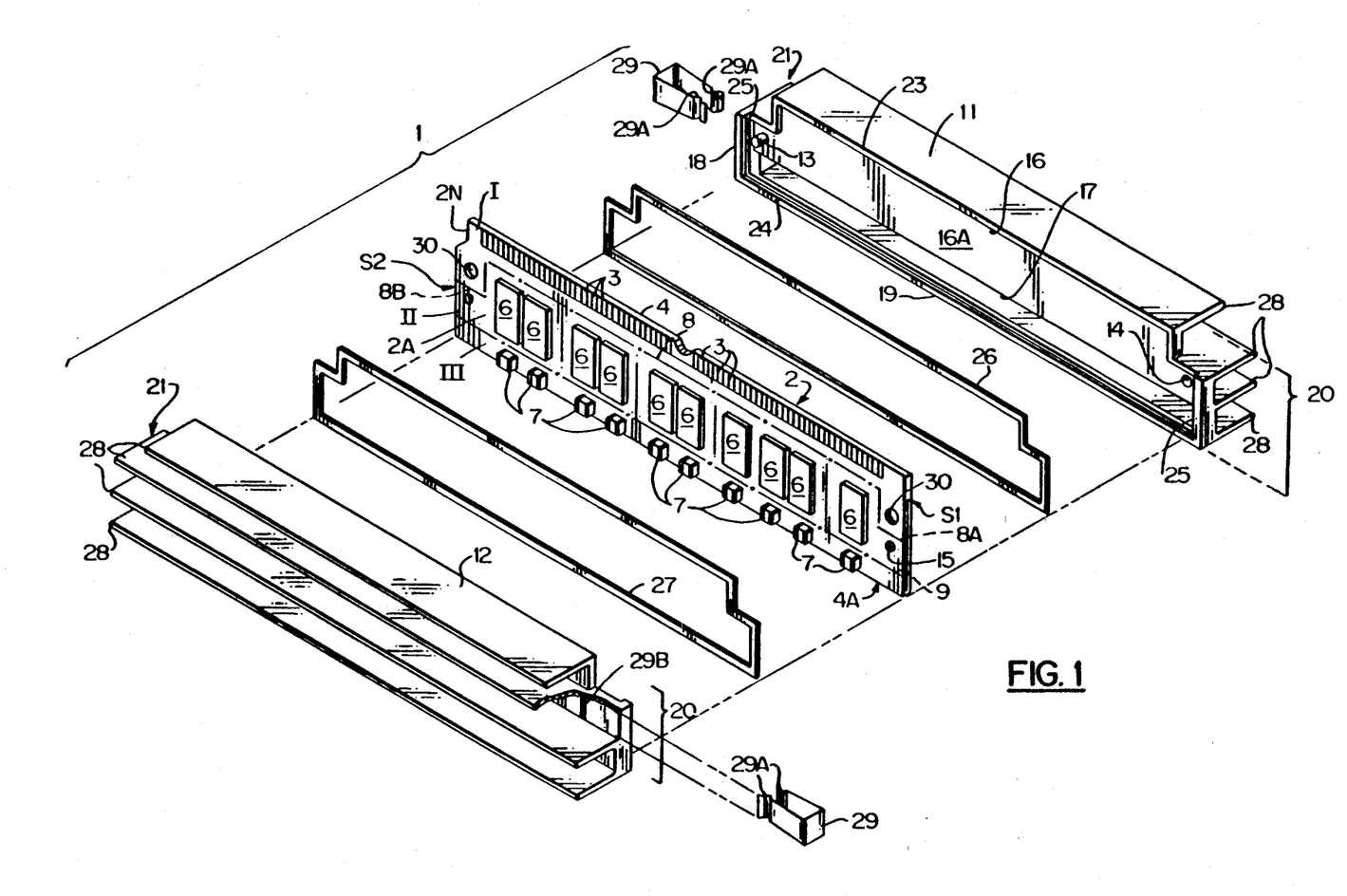
FIG. 1 is an exploded perspective schematic view of a preferred embodiment of the electronic circuit package assembly and of the heat sink housing of the present invention.

Substrate 2 has three regions generally indicated by the reference numbers I, II and III, FIG. 1. Located in the first region I are a portion of the first circuit pattern on surface 2A and its row of PC terminals 3. Region I in the embodiment of FIG. 1, as viewed facing that Figure, has an inverted U-shape like configuration delineated by the boundary indicated by the dash-dot line 8 in FIG. 1 between regions I and II and which extends to the lateral edges S1 and S2 of substrate 2. The base part of the U-shaped portion of the line 8 and the two wing tip parts 8A and 8B of line 8 that extend from the leg parts of the U-shaped portion are parallel to the edge 4; whereas, the leg parts of the U-shaped portion portions of line 8 are parallel to the edges S1 and S2. Region I is coextensive with the edge 4 and the line 8 and it extends between the surfaces 2A and 2B encompassed between the edge 4 and the line 8.

The low profile devices 6 and 6' are located in the middle region II of substrate 2. Region II in the embodiment of FIG. 1 is coextensive with the aforementioned common imaginary boundary line 8 (which it shares with region I) and the rectilinear boundary line indicated by the dash-dot line 9, FIG. 1 (which it shares with region III). Region II extends between the surfaces 2A and 2B encompassed between the lines 8 and 9, the latter being parallel to the edge 4.

The higher profile components 7 and 7' are located in the third region III of substrate 2. Region III is coextensive with the aforementioned common imaginary boundary line 9 (which it shares with region II) and the edge 4A, which is opposite to and parallel with the edge 4 of substrate 2. Region III extends between the surfaces 2A and 2B encompassed between the edge 4A and the line 9.

Figure 2:
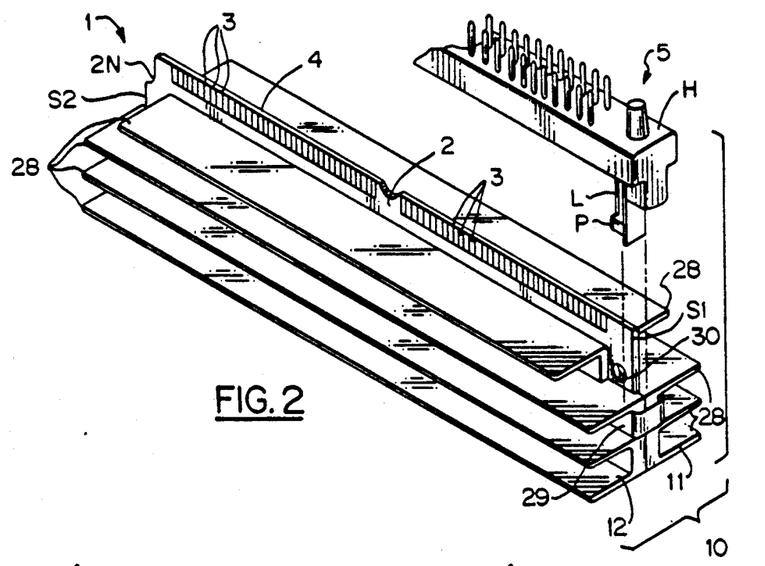
FIG. 2 is a perspective schematic view of the assembled package assembly and heat sink housing shown in FIG. 1.

A heat sink housing generally indicated by the reference number 10, FIG. 2, has substantially two identical first and second heat conductive members 11 and 12, which when assembled as shown in FIG. 2 define an enclosure. More particularly, the enclosure 11-12 encloses the two regions II and III of the substrate 2 and the devices 6 and 6' and the circuit components 7 and 7' mounted in the second and third regions II and III, respectively. The first region I and the edge 4 extend outwardly from the enclosure 11-12, as will be discussed hereinafter.

The assembly 1 and more particularly the heat sink housing 10 has internal means for retaining the first and second members 11 and 12 together and the substrate 2 in registration with the enclosure 11-12 defined thereby. Preferably, the retention means comprises at least one retention post located on and extending from one (e.g. member 11) of the members 11 and 12, and a retention receiving recess located in the other (e.g. member 12) of the members 11 and 12 for receiving the post therein. For the particular embodiment of FIG. 1, two posts, one each on member 11 and 12, respectively, and two post receiving recesses, one each on member 11 and 12, are provided. Thus, it should be understood that in FIG. 1 retention post 13 extends from member 11 towards and into an aligned post receiving recess, not shown, in member 12, on the left side of the assembly 1 as viewed facing FIG. 1; and the post receiving recess 14 of member 11 receives a retention post, not shown, extending from the member 12 towards and into the aligned post receiving recess 14 of member 11 on the right side of the assembly 1 as viewed facing FIG. 1. The two posts also pass thru two respectively aligned therewith seating openings 15 provided in the substrate 2 for this purpose. To assemble the members 11 and 12, the respective posts, e.g. post 13, after passing thru the openings 15, engage their aligned respective post receiving recesses with a predetermined tolerance fit, e.g. a snug fit, and as such the two members 11 and 12 are snap fitted together for assembly. Thus, it can be seen that the assembly 1 and the heat sink housing 10 are readily assembled and/or disassembled. Furthermore, these retention posts coact with the respective openings 15, which are located in substrate 2, to seat the substrate 2 in the enclosure defined by the assembled members 11 and 12 and thus retain the substrate 2 and consequently the mounted devices 6 and 6' and the components 7 and 7' in a predetermined registration with the housing 10 and hence the assembly 1.

Each of the members 11 and 12 has a pair of adjacent recessed chambers, cf. chambers 16 and 17 of member 11. Chamber 16 of member 11 is in open facing relationship with the remote surface 2B of substrate 2 and is substantially concentrically aligned with the region II. When assembly 1 is assembled, chamber 16 receives and houses therein the chip devices 6' mounted on surface 2B in the region II. Similarly, the corresponding chamber, not shown, of member 12 is in open facing relationship with the surface 2A and is substantially concentrically aligned with the region II so that when assembly 1 is assembled, the last mentioned chamber receives and houses therein the devices 6 mounted on the surface 2A. As will be apparent from the description hereinafter, the height profiles, i.e. depths, of chamber 16 of member 11 and of its counterpart, not shown, of member 12 are judiciously selected to be compatible to the aforementioned height profiles of the aforesaid IC devices 6' and 6, respectively.

Chamber 17 of member 11 is in open facing relationship with the surface 2B and is substantially concentrically aligned with the region III. When assembly 1 is assembled, chamber 17 receives and houses therein the circuit components 7' mounted on surface 2B in the region III. Similarly, the corresponding chamber, not shown, of member 12 is in facing relationship with the surface 2A and is substantially concentrically aligned with the region III so that when assembly 1 is assembled, the last mentioned chamber receives and houses therein the components 7 mounted on the surface 2A. The height profiles, i.e. the depths, of chamber 17 of member 11 and its counterpart, not shown, of member 12 are judiciously selected to be compatible with the height profiles of the components 7' and 7, respectively.

Moreover, by judiciously selecting the height profiles of the chambers 16 and 17 of member 11 and their corresponding counterparts of member 12, the respective devices 6,6' and components 7,7' housed therein may be in direct contact with or alternatively in a close spatial proximity with the respective planar walls of the chambers to enhance thermal conduction from the heat generating devices 6,6' and components 7,7' to the heat sink enclosure 11–12.

Further thermal enhancement may be provided by using suitable compressible thermally conductive means, such as wire mesh, conductive wool, springs, elastomers and the like. Preferably the compressible thermally conductive means is thermal grease, not shown, which is provided as an interface medium between the devices 6',6 and the respective planar walls (cf. wall 16A, FIG. 5) of the chamber 16 and its counterpart, respectively, of member 12; and in a similar manner thermal grease, not shown, is provided as an interface medium between the components, 7',7 and the respective planar walls (cf. wall 17A, FIG. 5) of chamber 17 and its counterpart, respectively.

Figure 3:
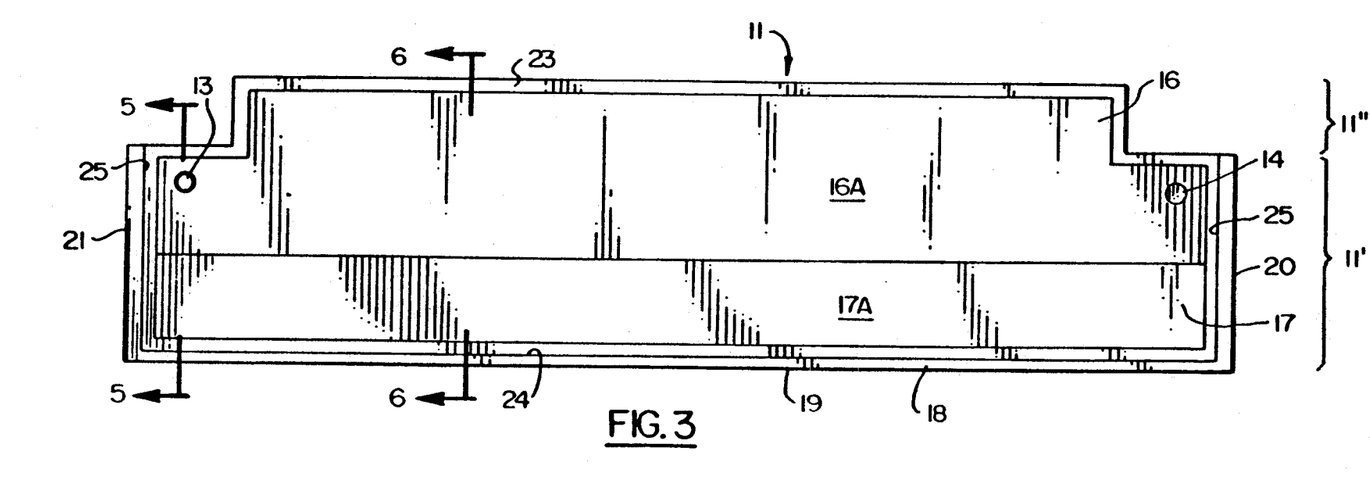
FIG. 3 is an enlarged side elevation view of one of the heat sink housing members shown in FIG. 1.
Figure 4:
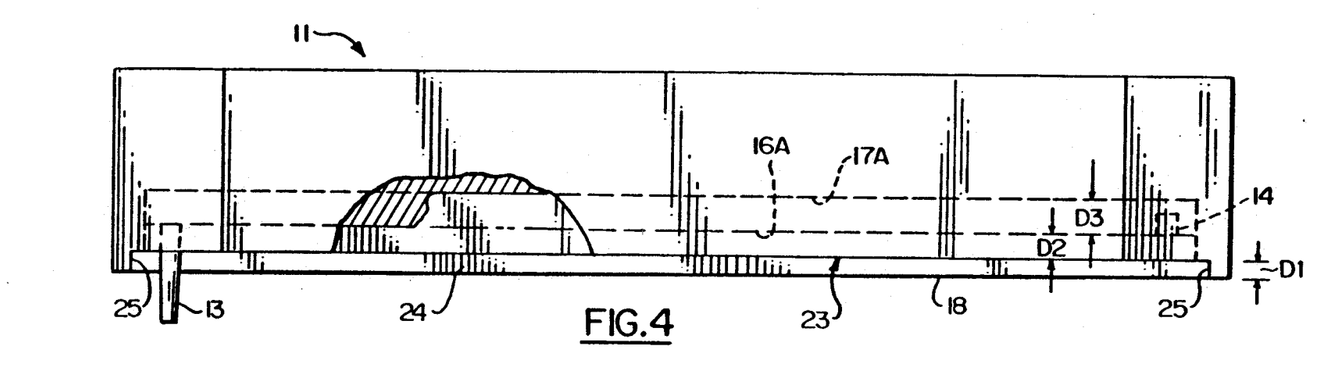
FIG. 4 is a top elevation view of the heat sink housing member shown in FIG. 3.
Figure 5:
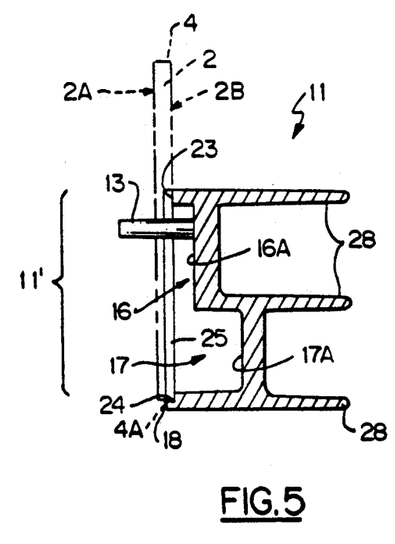
FIGS. 5 and 6 are cross sectional views of the heat sink housing member shown in FIG. 3 taken along the lines 5—5 and 6—6, respectively, thereof.

The enclosure defined by the members 11 and 12 will now be discussed in greater detail with reference to FIGS. 3–6. For sake of simplicity only the member 11 is shown in FIGS. 3–6. It should be understood, however, that the members 11 and 12, when assembled, have mirror symmetry configurations (except for the aforementioned posts and their complementary receiving recesses). Thus, excluding the noted exception, for each of the parts of member 11 there is a mirror symmetry counterpart in member 12. In FIG. 3, member 11 is viewed looking into the chambers 16 and 17.

Member 11 has a peripheral U-shaped lip surface 18, which for sake of explanation is assumed to lie in the plane of FIG. 3. The base and two legs of the U-shaped surface 18 are the frontal edges of the rectilinear elongated side 19 and two shorter lateral sides 20,21, respectively, of member 11. Recessed slightly back in a step like transition at a distance D1, cf. FIG. 4, from surface 18 and parallel thereto is a closed ring-like parallel surface 23 which has a configuration compatible to the composite periphery of the regions II,III, which periphery is defined by the inverted wing tip U-shaped line 8, the edge 4A, and the portions of the side edges S1,S2 encompassed there between, cf. FIG. 1. Transition surfaces 24 and 25 are orthogonal to U-shaped surface 18 and to surface 23. Recessed back a distance D2 from surface 23 in a step like transition is the parallel surface of wall 16A of chamber 16; and recessed back a distance D3 from the surface of wall 16A in a step like transition is the parallel surface of wall 17A of chamber 17, and hence by definition the surface of wall 17A is recessed a distance equal to the sum of D2 and D3 from the surface 23.

It should be noted that the elongated surface 24 and the pair of upright surfaces 25 together with the adjacent thereto parts of the surface 23 form an L-angle channel. More particularly, the last mentioned adjacent parts of the surface 23 form the vertical of the L-angle channel and the surfaces 24 and 25 form the horizontal of the L-angle channel as viewed facing FIG. 3, and the channel itself has an over-all U-shape derived from the U-shape configuration of its constituent surfaces 24,25, the latter surfaces 24,25 being in turn orthogonal to and coextensively aligned with the U-shaped surface 18. In the embodiment of FIGS. 1–6, the lower, as viewed facing FIG. 1, parts of members 11 and 12, cf. part 11' of member 11, FIG. 3, have rectangular configurations and superimposed on each of the lower parts is a cupola-like part, cf. part 11", FIG. 3, with a smaller rectangular configuration.

When members 11 and 12 are assembled, the substrate 2 is seated at its openings 15 on the retention post 13 of member 11 and the counterpart post, not shown, of member 12 and the members 11 and 12 are snap fitted together through the coaction of the respective retention post 13 of member 11 with the retention recess, not shown, of member 12 and the retention post, not shown, of member 12 with the retention recess 14 of member 11. As a result, the surface 18 of member 11 is in alignment and direct contact with the counterpart surface of member 12, and the aforedescribed U-shaped L-angle channel of member 11 formed by the surfaces 24,25 and the adjacent parts of the surface 23 is in juxtaposed mirror symmetry alignment with the counterpart U-shaped L-angle channel, not shown, of member 12. The two channels thus enclose the substrate 2 around its edge 4A and a lower, as viewed facing FIG. 1, portion of each of its side edges S1 and S2, with the surfaces 24 and 25 of member 11 and the counterpart surfaces of member 12.

Distance D1 of member 11 and the counterpart distance of member 12 are judiciously selected so that the edge 4A of substrate 2 and the aforementioned lower portions of the two side edges S1,S2 (which lower portions are encompassed between the edge 4A and line 8) are in adjacent close proximity to and straddle the surfaces 24–25 of member 11 and the counterpart surfaces of member 12, and so that the surface 23 of member 11 and the counterpart surface of member 12 are in adjacent close proximity and substantially parallel to the surfaces 2B and 2A, respectively, of substrate 2 at the composite periphery of the regions II,III. Thus, housing 10 provides an environmental protective enclosure that encloses the regions II and III and the mounted devices 6,6' and components 7,7'''; and region I protrudes externally from the housing 10.

Surface 23 and its counterpart surface may be coated with an electrical insulated material to prevent shortening of any PC conductors of the circuit patterns on the surfaces 2B and 2A which may come contact therewith. However, it is preferred to use compressible electrical insulation/hermetic seal or gaskets 26 and 27 with coextensive and compatible configurations as the surfaces 23 and counterpart surface of member 12, as shown in FIG. 1. As such, the gaskets 26 and 27 provide an environmental protective seal that hermetically encloses the regions II and III and the mounted elements 6, 6", 7 and 7" thereon.

Housing 10 has on each of its members 11 and 12 a set of external plural, e.g. four, parallel aligned planar cooling fins 28. Each of the fins 28 of member 11 is in coplanar and coextensive alignment with a mutually exclusive one of the fins 28 of member 12, and the planes of the fins 28 are orthogonal to the surface 23 and counterpart surface of member 12, and 2B of the substrate 2 and hence to the surfaces 2A and 2B of the substrate 2 when the assembly 1 is assembled.

To prevent accidental separation of the members 11 and 12 and/or to supplement or enhance the retention provided by the internal retention posts and their coacting retention post receiving recesses, cf. post 13 and recess 14 of member 11, external clamp means are provided In the embodiment of FIG. 1, two U-shaped spring clamps 29, each having a pair of inwardly biased resilient legs and an integral base, are used. At the right end of the assembly 1 as viewed facing FIG. 1, one of the clamps 29 has one of its legs slidably inserted between two adjacent fins 28 of the member 11 and its other leg slidably inserted between the corresponding aligned adjacent fins 28 of the member 12, and its base straddles the side edge 20 and the adjacent counterpart edge of member 12. In a similar manner, at the left end of the assembly, the legs of the other clamp 29 are engaged between the same pair of adjacent fins 28 of members 11 and 12 that the clamp 29 at the right end engages, and its base straddles the edge 21 and the counterpart edge of member 12. As a result, the members 11 and 12 are compressively held together by the clamps 29 and in a direction opposite to the direction of a force that would tend to pull the members 11 and 12 apart. Moreover, the adjacent fins 28 between which the legs of the clamps 29 are inserted act as stops and/or guards that prevent accidental displacement and/or dislodgement of the clamps 29 from the members 11 and 12. The legs of clamps 29 have transverse inwardly facing linear protrusions 29A, each of which engages a linear receiving recess 29B formed in the respective exterior faces of the members 11 and 12 so as to further enhance maintenance of the clamp to the housing 10.

As aforementioned, the embodiment of FIGS. 1-6 is particularly useful for an edge type connector 5 of the kind disclosed in the previously mentioned AMP Inc. publication. As partially shown in FIG. 2, that kind of connector has integral latches L, only one of which is shown in FIG. 2 for sake of explanation, at each end of an elongated side of the housing H. The latch L has a protrusion P. When the assembly 1 and more particularly the edge 4 is inserted into the opening, not shown, of connector 5 and the terminals 3 mated with the spring contacts, not shown, of connector 5, each latch L is biased such that its respective protrusion P engages one of the two latch receiving openings 30, which extend through the substrate 2. The cupola configuration of the housing members 11 and 12 allows the holes 30, which are in region I of the substrate 2, to be accessible to the latches L and their protrusions P. As a result, the substrate 2 and hence the assembly 1 and its housing 10 are latchable to the connector 5.

Figure 7:
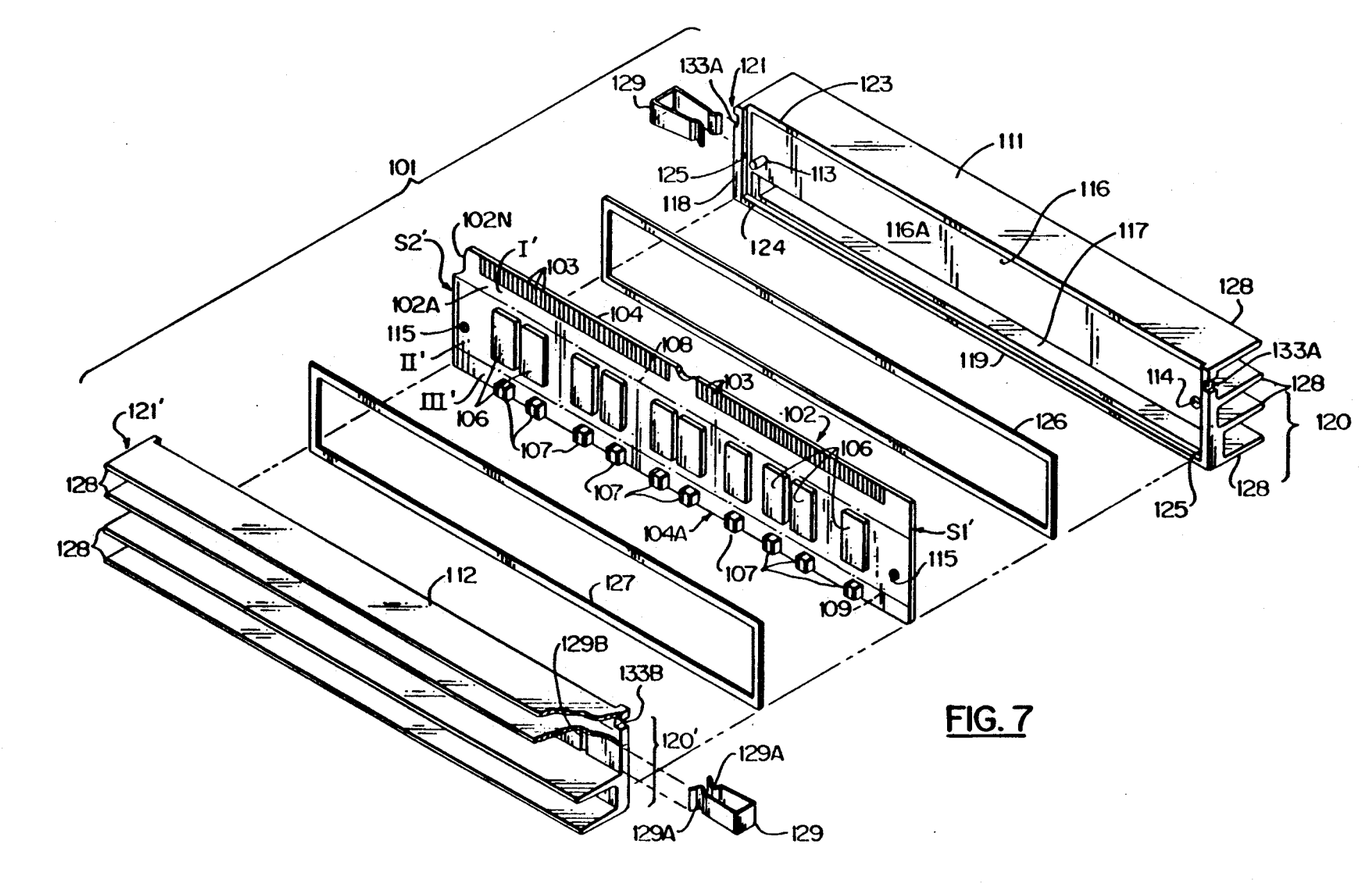
FIG. 7 is an exploded perspective schematic view of another preferred embodiment of the electronic circuit package assembly and of the heat sink housing of the present invention.
Figures 8, 9, 10, 11:
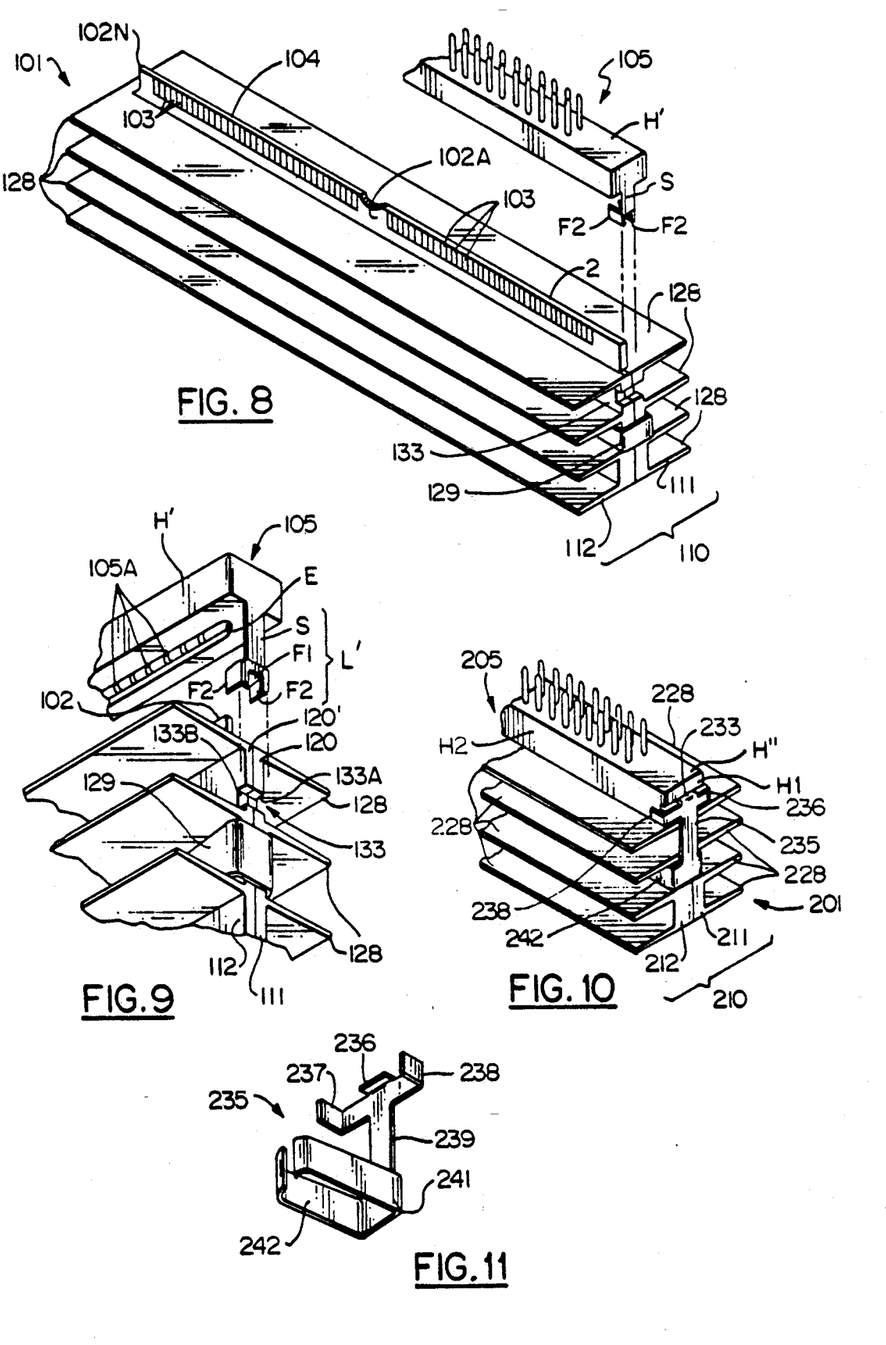
FIG. 8 is a perspective schematic view of the assembled package assembly and heat sink housing shown in FIG. 7.
FIG. 9 is an enlarged partially shown perspective schematic view of an edge type connector having a preferred latching member for engaging the heat sink housing of FIG. 8.
FIG. 10 is a partially shown cross sectional view of still another embodiment of the present invention.
FIG. 11 is an enlarged perspective view of the detachable clamp and retention member shown in FIG. 10.

Referring now to the embodiment of FIGS. 7-9, the electronic circuit package assembly is generally indicated by the reference number 101. It has a planar printed circuit substrate 102, e.g. a printed circuit board or card, with a rectangular-like configuration. The side of substrate 102, as viewed facing FIG. 7, has a major outer surface 102A on which is disposed a circuit pattern of printed circuit conductors, the details of which (except for the terminals 103 hereinafter described) are omitted in the Figures for sake of clarity. On the opposite side of substrate 102 there is also another printed circuit conductor pattern, not shown, disposed on the substrate's other major outer surface, not shown for sake of simplicity. The two circuit patterns are interconnected by conductive means, not shown, such as, for example, conductive vias or plated through holes in the substrate 102. The two circuit patterns have aligned rows of I/O PC terminals, cf. row of terminals 103 on surface 102A, that are in substantial parallel alignment with and located in substantial proximity to the edge 104 of substrate 102. The edge 104 and the terminals 103 and those, not shown, on the opposite surface are pluggable into a compatible edge type connector 105, which is partially schematically shown in FIGS. 8 and 9, for connection thereto. Connector 105 has opposing rows of spring contacts, one of the rows of contacts 105A being partially viewable in FIG. 9. The last mentioned row of contacts mate with the PC terminals, not shown, on the remote, as viewed facing FIG. 7, surface of substrate 102, and the other row of contacts, not shown, mate with the terminals 103 on surface 102A of substrate 102.

The substrate 102 has three regions I', II', III' separated by the imaginary boundary rectilinear lines 108 and 109, which are parallel to the edge 104. In regions II' and III', there are mounted to surface 102A respectively a row of low profile integrated circuit chip devices 106, which are preferably IC chips, and a row of high profile circuit components 107, which preferably are discrete capacitors, the devices 106 and 107 being mounted to the surface 102A and connected to the circuit pattern thereon in the same manner as the devices 6 and components 7 are mounted to substrate 2 and connected to the circuit pattern on surface 2A in the embodiment of FIG. 1. In a similar manner there is a row of low profile IC devices, not shown, and a row of high profile circuit components mounted on the other surface of substrate 102 and connected to the circuit pattern thereon in the regions II' and III', respectively. The rows of IC devices and circuit components mounted on both surfaces of the substrate 102 are substantially parallel to the edge 104.

Heat sink housing 110 has two members 111 and 112 which when assembled as shown in FIG. 8 define an enclosure. The enclosure 111-112 encloses the two regions II' and III', each of the members 111 and 112 having a pair of compatible profile recessed chambers, cf. low profile chamber 116 and high profile chamber 117 of member 111, that receive therein the aforementioned low profile devices and high profile components, respectfully, mounted on the surface of substrate 102 which the particular chamber is facing. Moreover, the low profile chambers and the high profile chambers are concentrically aligned with regions II' and III', respectively; and, as seen in FIG. 8, region I' (with the terminals, cf. terminals 103, on both surfaces of substrate 102 and edge 104) extends outwardly from the enclosure 111-112.

Assembly 101 and more particularly the heat sink housing 110 has a pair of retention posts and pair of retention post receiving recesses for retaining the two members 111 and 112 together and the substrate 102 in registration with the enclosure 111-112 defined thereby. One retention post 113 is located at the left end of member 111 and extends from member 111 towards and into an aligned retention receiving recess, not shown, located in member 112. The other post receiving recess 114 is located at the right end of member 111 and receives therein a retention post, not shown, located on and extending from the member 112. The two posts also pass thru two respectively aligned therewith seating openings 115 provided in the substrate 102 for this purpose.

To assemble the members 111 and 112, the respective posts, after passing thru the openings 115, engage their aligned respective post receiving recesses with a predetermined tolerance fit, e.g. a snug fit, and as such the two members 111 and 112 are snap fitted together for assembly.

By judiciously selecting the height profiles of the chambers 116 and 117 of member 111 and their corresponding counterparts of member 112, the respective devices and components housed therein may be in direct contact with or alternatively in close spatial proximity with the respective planar walls of the chambers to enhance thermal conduction from the heat generating devices and components to the heat sink enclosure 111-112.

Compressible thermally conductive means may be provided for further thermal enhancement, and preferably it is thermal grease, not shown, that is judiciously applied to the devices and components, e.g. devices 106 and components 107, in a manner similar to that described for the embodiment of FIGS. 1-6.

Members 111 and 112, when assembled, have mirror symmetry configurations (except for the retention posts and their complementary receiving recesses). Thus, excluding the noted exception, for each of the parts of member 111 there is a mirror symmetry counterpart in member 112.

Member 111 has a peripheral U-shaped lip surface 118. The base and two legs of the U-shaped surface 118 are the frontal edges of the rectilinear elongated side 119 and two shorter lateral sides 120,121, respectively, of member 111. Recessed slightly back in a step like transition from surface 118 and parallel thereto is a closed ring-like parallel surface 123 which has a rectangular configuration compatible to the composite rectangular peripheral configuration of the regions II',III', which last mentioned periphery is defined by line 118, the edge 104A, and the portions of the side edges S1',S2' encompassed there between. Transition surfaces 124 and 125 are orthogonal to U-shaped surface 118 and to surface 123. Recessed back from surface 123 in a step like transition is the parallel surface of wall 116A of chamber 116; and recessed back from the surface of wall 116A in a step like transition is the parallel surface of wall, not shown, of chamber 117.

It should be noted that the elongated surface 124 and the pair of upright surfaces 125 together with the adjacent thereto parts of the surface 123 form an L-angle channel with an over all U-shape configuration.

When members 111 and 112 are assembled, the substrate 102 is seated at its openings 115 on the retention post 113 of member 111 and the counterpart post, not shown, of member 112 and the members 111 and 112 are snap fitted together. As a result, the surface 118 of member 111 is in alignment and direct contact with the counterpart surface of member 112, and the aforedescribed U-shaped L-angle channel of member 111 is in juxtaposed mirror symmetry alignment with the counterpart U-shaped L-angle channel, not shown, of member 112. The two channels thus enclose the substrate 102 around its edge 104A and the lower portions (i.e. portions extending between line 109 and edge 104A) of its side edges S1' and S2' with the surfaces 124 and 125 of member 111 and the counterpart surfaces of member 112.

The edge 104A of substrate 102 and the aforementioned lower portions of the two side edges S1',S2' are in adjacent close proximity to and straddle the surfaces 124-125 and the counterpart surfaces of member 112; and the surface 123 of member 111 and the counterpart surface of member 112 are in adjacent close proximity and substantially parallel to the respective adjacent surfaces thereto of substrate 102 at the previously described composite rectangular periphery of the regions II',III'. Thus, housing 110 provides an environmental protective enclosure that encloses the regions II' and III' and the mounted devices and components and has region I' protruding externally from the it, i.e. housing 110.

Surface 123 and its counterpart surface may be coated with an electrical insulation material to prevent shortening of any PC conductors of the circuit patterns on the surfaces of substrate 102 which may come contact therewith. However, it is preferred to use compressible electrical insulation/hermetic seals or gaskets 126 and 127 with coextensive and compatible configurations as the surfaces 123 and counterpart surface of member 112, as shown in FIG. 7. As such, the gaskets 126 and 127 provide an environmental seal that hermetically encloses the regions II' and III' and the devices and components, respectively, mounted thereon.

Housing 110 has on each of its members 111 and 112 a set of external plural, e.g. four, parallel aligned planar cooling fins 128. Each of the fins 128 of member 111 is in coplanar and coextensive alignment with a mutually exclusive one of the fins 128 of member 112, and the planes of the fins 128 are orthogonal to the surface 123 and counterpart surface of member 112, and hence to the planar surfaces of the substrate 102 when the assembly 101 is assembled.

To prevent accidental separation of the members 111 and 112 and/or to supplement or enhance the retention provided by the internal retention posts and their coacting retention post receiving recesses, two external U-shaped spring clamps 129 are provided, in the same manner as the clamps 29 of the embodiment of FIGS. 1-6, so that the members 111 and 112 are compressively held together. The adjacent fins 128 between which the legs of the clamps 129 are inserted act as stops and/or guards that prevent accidental displacement and/or dislodgement of the clamps 129 from the members 111 and 112.

In the embodiment of FIGS. 7-9, the latching means for latching the assembly 101 to the connector 105 interacts directly with the housing 110. More particularly, in the embodiment of FIGS. 7-9, two integral resilient latch members L' are provided on opposite ends of the housing H' of connector 105. Only the latch member L' located at the right end of the connector 105 is shown for sake of clarity in FIGS. 8-9. The tip of each latch L' has an inwardly formed flange F1 and two parallel flanges F2, the plane of flange F1 and the plane of each flange F2 being orthogonal to each other and the plane of the stem S of the latch L'.

Inwardly formed on both sides of housing 111-112 are U-shaped latch receiving recesses generally indicated by the reference number 133. More particularly, shown in greater detail in FIGS. 8-9 for sake of explanation, is the recess 133 on the right side of housing 111-112. This last mentioned recess 133 is formed from the two aligned U-shaped recesses 33A and 133B in lateral sides 120 and 120', respectively, of members 111 and 112, respectively. When the edge 104 of the substrate 102 is plugged/inserted into the elongated opening E of the housing H' of connector 105, the peripheral terminals (i.e. the row of terminals 103 on surface 102A and the row of corresponding terminals, not shown, on the opposite surface, not shown, of substrate 102) are in aligned mating relationship with the opposing rows of spring contacts 105A of connector 105, and the inward bias of the resilient stems S of the latches L' causes the latch flanges F1 to engage the particular recess 133 to which the particular flange F1 is adjacent and to cause furthermore the two parallel flanges F2 to straddle and compressively engage and/or clamp there between the two upright portions of the members 111 and 112, respectively, that is to say the two adjacent upright portions of the members 111 and 112 that bridge the two adjacent cooling fins 128 between which the flanges F2 are inserted.

Referring now to the embodiment of FIGS. 10-11, the assembly 201 and its heat sink housing 210 is substantially identical to the assembly 101 and housing 110 of the embodiment of FIGS. 7-9, except that the two latch receiving recesses 233 (only one of which is shown in FIG. 10) are located on the sides of the connector 205 and are engaged by individual latch members 235 (only one of which is shown in FIG. 10) connected to the heat sink housing 210. More particularly, the recesses 233 are transverse U-shaped channels inwardly formed on the lateral sides H1 of the housing H" of the connector 205. The latch member 235, as shown in greater detail in FIG. 11, is resilient and has a flange 236 which is received by its associated channel recess 233 and a pair of resilient flanges 237 and 238 which compressively engage there between the two parallel elongated sides H2 of housing H". Flanges 237 and 238 are located at one end of the elongated body 239 of member 235. The other end of the body 239 is formed into a U-shaped clamp having parallel resilient legs 241 and 242 and which has the same functional relationship with the members 211 and 212 and the pair of adjacent fins 228 between which the legs 241 and 242 are inserted as the clamps 29 and 129 have with their respective heat sink housings 10 and 110.

It should be understood that the invention may be modified in other ways without departing from the principles of the invention. For example, by using the embodiments of FIGS. 7-9 and 10-11, the need for latch receiving openings in the substrates thereof (such as the openings 30 of substrate 2 of the embodiment of FIGS. 1-6) are obviated, and thereby make additional real estate available for circuitizing in the substrates thereof. Also, while the embodiments are described with single rows of I/O terminals and single rows of devices and components on one or both sides of the substrates, plural rows may used. For example, two adjacent rows of I/O terminals may be employed on each side of the substrate adjacent the pluggable edge, in which case it would be used with an edge type connector having a set of upper and lower rows of mating contacts and another set of upper and lower opposing mating contacts. The heat sink members may be made out of any suitable heat conducting material, for example, metal such as aluminum and the like.

Thus, while the invention has been described with reference to preferred embodiments thereof, it will be understood by those skilled in the art that various changes in form and detail may be made without departing from the scope of the invention.

We claim:

1. An electronic circuit package assembly pluggable into an edge type connector, said assembly comprising:
a planar printed circuit substrate having a rectangular configuration and first and second parallel major outer surfaces with first and second predetermined circuit patterns, respectively, thereon, and conductive means in said substrate for interconnecting said first and second patterns, said substrate having a predetermined first region including therein a portion of at least said first circuit pattern, said portion having at least one row of input/output printed circuit terminals, said row of input/output printed circuit terminals being in substantial proximity alignment with and located in substantial proximity to a predetermined edge of said substrate, said predetermined edge and said input/output printed circuit terminals being pluggable into a compatible edge type connector for connection thereto;
at least one first row of first integrated circuit chip means mounted on said first major surface and connected to said first circuit pattern;
at least one second row of second integrated circuit chip means mounted on said second major surface and connected to said second circuit pattern, said mounted first and second chip means having a predetermined first height profile, said first and second rows of mounted chip means being in substantial parallel alignment with said predetermined edge, said mounted first and second chip means further being located in a second region of said substrate;
at least one row of circuit components mounted on at least a predetermined one of said major surfaces and connected to said circuit pattern on said predetermined one of said major surfaces on which said circuit components are mounted, said mounted circuit components having a predetermined second height profile larger than said first height profile, said row of said circuit components being in substantial parallel alignment with said predetermined edge, said circuit components further being located in a third region of said substrate;
heat sink housing means having first and second heat sink housing members in an abutting facing relationship defining an enclosure, said enclosure enclosing therein said second and third regions of said substrate and said mounted chip means and said circuit components located respectively therein, said first region and said predetermined edge being extended outwardly from said enclosure; and
retention means for retaining said first and second heat sink housing members together and said substrate in registration with said enclosure defined thereby, said retention means further comprising a first retention post extending from one of said first and second heat sink housing members and a first recess in the other of said first and second heat sink housing members for receiving therein said first post with a predetermined tolerance fit to retain said first and second heat sink housing members together, said substrate further having a first opening extending there through, said first post passing through said first opening to maintain said substrate in said registration with said enclosure.

2. An electronic circuit package assembly according to claim 1, wherein said retention means further comprises a second retention post extending from one of said first and second heat sink housing members and a second recess in the other of said first and second heat sink housing members for receiving therein said second post with a predetermined tolerance fit, said second post and said second recess coacting with said first post and said first recess to retain said first and second heat sink housing members together, said substrate further having a second opening extending there through, said second post passing through said second opening, said second post and said second opening coacting with said first post and said first opening to maintain said substrate in registration with said enclosure.

3. An electronic circuit package assembly according to claim 2 wherein said first post extends from said first heat sink housing member and said second post extends from said second heat sink housing member.

4. An electronic circuit package assembly according to claim 1 wherein said first and second heat sink housing members are in facing relationship with said first and second major surfaces, respectively, of said substrate, each of said heat sink housing members having first and second recessed chambers for receiving therein the chip means and circuit components, respectively, mounted on the particular one of the major surfaces in facing relationship therewith.

5. An electronic circuit package assembly according to claim 1 further comprising latching means for latching said assembly to said compatible edge type connector.

6. An electronic circuit package assembly according to claim 5 wherein said latching means comprises a pair of latch receiving openings located in said first region of said substrate and extending through said substrate, and a pair of latches connected to said compatible edge type connector, said pair of latches being engagable with said pair of latch receiving openings for said latching of said assembly to said connector when said predetermined edge and said input/output printed circuit terminals are plugged into said compatible edge type connector for connection thereto.

7. An electronic circuit package assembly according to claim 5 wherein said latching means comprises at least one latch member and at least one latch receiving member engagable therewith, a predetermined one of said latch member and said latch receiving member being connected in a predetermined manner to said heat sink housing means and the other of said latch member and said latch receiving member being connected in a predetermined manner to said connector.

8. An electronic circuit package assembly according to claim 7 wherein said latch receiving member is connected to said heat sink housing means and said latch member is connected to said connector.

9. An electronic circuit package assembly according to claim 8 wherein said latch member further comprises resilient means for clamping said first and second heat sink members together when said latch member engages said latch receiving member.

10. An electronic circuit package assembly according to claim 7 wherein said latch receiving member is connected to said connector and said latch member is connected to said heat sink housing means.

11. An electronic circuit package assembly according to claim 10 wherein said latch member is demountably connected to said heat sink housing means, said latch member further, having resilient means for clamping said first and second heat sink housing members together when said latch member engages said latch receiving member.

12. An electronic circuit package assembly according to claim 1, said assembly further comprising first and second sets of corresponding plurality planar cooling fins outwardly extending from said first and second heat sink housing members, respectively, each of the cooling fins of said first set being parallel to and aligned with the other cooling fins of said first set, each of the cooling fins of said second set being parallel to and aligned with the other cooling fins of said second set, each of the cooling fins of said first set being further in substantial coplanar and coextensive alignment with a mutually exclusive one of the cooling fins of said second set.

13. An electronic circuit package assembly according to claim 12 further comprising at least one U-shaped clamping means for clamping said first and second heat sink housing members together, said clamping means having first and second resilient legs and an integral base, said first leg being slidably located between two adjacent fins of said first set and said second leg being slidably located between the corresponding two adjacent fins of said second set and said base straddling said first and second heat sink housing members at the edges thereof.

14. An electronic circuit package assembly according to claim 4, wherein said second and third regions of said substrate are adjacent to each other and collectively have a composite periphery on each of said first and second major surfaces of said substrate, said assembly further comprising first and second sealing means in a predetermined sealing contacting relationship with said heat sink housing means and said substrate, said first sealing means being in said predetermined sealing contacting relationship at said composite periphery of said first major surface, said second sealing means being in said predetermined sealing contacting relationship at said composite periphery of said second major surface, said first and second sealing means environmentally sealing said chip means and said circuit components within said heat sink housing means.

15. An electronic circuit package assembly according to claim 4 wherein said first and second chambers have third and fourth height profiles, respectively, compatible to said first and second height profiles, respectively, for receiving therein said chip means and said circuit components, respectively, in a predetermined thermal contacting relationship.

16. An electronic circuit package assembly according to claim 15 further comprising compressible thermally conductive means disposed in said first and second chambers, said thermally conductive means being in contact with said first and second chambers and with the respective said chip means and said components housed respectively therein to provide said predetermined thermal contacting relationship.

17. An electronic circuit package assembly according to claim 1 wherein said chip means comprise a plurality of integrated circuit chip directly bonded to said substrate.

18. An electronic circuit package assembly according to claim 1 wherein said chip means comprise a plurality of integrated circuit chip modules bonded to said substrate.

19. An electronic circuit package assembly according to claim 4 wherein each of said first and second heat sink housing members of said heat sink housing means further comprises:
 a U-shape first planar surface,
 a ring-like second planar surface parallel to said U-shaped first planar surface and having a predetermined configuration, and
 a transition surface inwardly recessed from said U-shaped first planar surface at a substantially right angle thereto and being extended between said U-shaped first planar surface and said ring-like second planar surface, said first and second chambers being inwardly recessed from said ring-like second planar surface; and
wherein said U-shaped first planar surfaces of said first and second heat sink housing members are in aligned abutting contact with each other in said abutting relationship, and wherein said enclosure encloses said second and third regions of said substrate between said transition surfaces of said first and second heat sink housing members and between said ring-like second planar surfaces of said first and second heat sink housing members.

20. Heat sink apparatus for an electronic circuit package assembly, said package assembly including a planar printed circuit substrate having a rectangular configuration and first and second parallel major outer surfaces with first and second predetermined circuit patterns, respectively, thereon, and conductive means in said substrate for interconnecting said first and second patterns, said substrate having a predetermined first region including therein a portion of at least said first circuit pattern, said portion having at least one row of input-/output printed circuit terminals, said row of input/output printed circuit terminals being in substantial parallel alignemtn with and located in substantial proximity to a predetermined edge of said substrate, said predetermined edge and said input/output printed circuit terminals being pluggable into a compatible edge type connector for connection thereto, and said assembly further having at least one first row of first integrated circuit chip means mounted on said first major surface and connected to said first circuit pattern, at least one second row of second integrated circuit chip means mounted on said second major surface and connected to said second circuit pattern, said mounted first and second chip means having a predetermined first height profile, said first and second rows of mounted chip means being in substantial parallel alignment with said predetermined edge, said mounted first and second chip means further being located in a second region of said substrate, at least one row of circuit components mounted on at least a predetermined one of said major surfaces and connected to said circuit pattern on said major surface on which said circuit components are mounted, said mounted circuit components having a predetermined second height profile larger than said first height profile, said row of said circuit components being in substantial parallel alignment with said predetermined edge, said circuit components further being located in a third region of said substrate, said heat sink apparatus comprising: heat sink housing means having first and second heat sink housing members in an abutting facing relationship defining an enclosure for enclosing therein said second and third regions of said substrate and said mounted chip means and said circuit components located respectively therein, and said first region and said predetermined edge being extended outwardly from said enclosure; and retention means for retaining said first and second heat sink housing members together and said substrate in registration with said enclosure defined thereby, said retention means further comprising a first retention post extending from one of said first and second heat sink housing members and a first recess in the other of said first and second heat sink housing members for receiving therein said first post with a predetermined tolerance fit to retain said first and second heat sink housing members together, said substrate further having a first opening extending there through, said first post passing through said first opening to maintain said substrate in said registration with said enclosure.

21. Heat sink apparatus according to claim 20, wherein said retention means further comprises a second retention post extending from one of said first and second heat sink housing members and a 5 second recess in the other of said first and second heat sink housing members for receiving therein said second post with a predetermined tolerance fit, said second post and said second recess coacting with said first post and said first recess to retain said first and second heat sink housing members together, said substrate further having a second opening extending there through, said second post passing through said second opening, said second post and said second opening coacting with said first post and said first opening to maintain said substrate in registration with said enclosure.

22. Heat sink apparatus according to claim 21 wherein said first post extends from said first heat sink housing member and said second post extends from said second heat sink housing member.

23. Heat sink apparatus according to claim 20 wherein said first and second heat sink housing members are in facing relationship with said first and second major surfaces, respectively, of said substrate, each of said heat sink housing members having first and second recessed chambers for receiving therein the chip means and circuit components, respectively, mounted on the particular one of the major surfaces in facing relationship therewith.

24. Heat sink apparatus according to claim 20 further comprising latching means for latching said assembly to said compatible edge type connector.

25. Heat sink apparatus according to claim 24 wherein said latching means comprises a pair of latch receiving openings located in said first region of said substrate and extending through said substrate, and a pair of latches connected to said compatible edge type connector, said pair of latches being engagable with said pair of latch receiving openings for said latching of said assembly to said connector when said predetermined edge and said input/output printed circuit terminals are plugged into said compatible edge type connector for connection thereto.

26. Heat sink apparatus according to claim 24 wherein said latching means comprises at least one latch member and at least one latch receiving member engagable therewith, a predetermined one of said latch member and latch receiving member being connected in a predetermined manner to said heat sink housing means and the other of said latch member and said latch receiving member being connected in a predetermined manner to said connector.

27. Heat sink apparatus according to claim 26 wherein said latch receiving member is connected to said heat sink housing means and said latch member is connected to said connector.

28. Heat sink apparatus according to claim 27 wherein said latch member further comprises resilient means for clamping said first and second heat sink housing members together when said latch member engages said latch receiving member.

29. Heat sink apparatus according to claim 26 wherein said latch receiving member is connected to said connector and said latch member is connected to said heat sink housing means.

30. Heat sink apparatus according to claim 29 wherein said latch member is demountably connected to said heat sink housing means, said latch member further having resilient means for clamping said first and second heat sink housing members together when said latch member engages said latch receiving member.

31. Heat sink apparatus according to claim 20, said apparatus further comprising first and second sets of corresponding plural planar cooling fins outwardly extending from said first and second heat sink housing members, respectively, each of the cooling fins of said first set being parallel to and aligned with the other cooling fins of said first set, each of the cooling fins of said second set being parallel to and aligned with the other cooling fins of said second set, each of the cooling fins of said first set being further being in substantial coplanar and coextensive alignment with a mutually exclusive one of the cooling fins of said second set.

32. Heat sink apparatus according to claim 31 further comprising at least one U-shaped clamping means for clamping said first and second heat sink housing members together, said clamping means having first and second resilient legs and an integral base, said first leg being slidably located between two adjacent fins of said first set and said second leg being slidably located between the corresponding two adjacent fins of said second set and said base straddling said first and second heat sink housing members at the edges thereof.

33. Heat sink apparatus according to claim 23, wherein said second and third regions of said substrate are adjacent to each other and collectively have a composite periphery on each of said first and second major surfaces of said substrate, said apparatus further comprising first and second sealing means in a predetermined sealing contacting relationship with said heat sink housing means and said substrate, said first sealing means being in said predetermined sealing contacting relationship at said composite periphery of said first major surface, said second sealing means being in said predetermined sealing contacting relationship at said composite periphery of said second major surface, said first and second sealing means environmentally sealing said chip means and said circuit components within said heat sink housing means.

34. Heat sink apparatus according to claim 23 wherein said first and second chambers have third and fourth height profiles, respectively, compatible to said first and second height profiles, respectively, for receiving therein said chip means and said circuit components, respectively, in a predetermined thermal contacting relationship.

35. Heat sink apparatus according to claim 34 further comprising compressible thermally conductive means disposed in said first and second chambers, said thermally conductive means being in contact with said first and second chambers and with the respective said chip means and said components housed respectively therein to provide said predetermined thermal contacting relationship.

36. Heat sink apparatus according to claim 23 wherein each of said first and second heat sink housing members of said heat sink housing means further comprises:

a U-shaped first planar surface,
a ring-like second planar surface parallel to said U-shaped first planar surface and having a predetermined configuration, and
a transition surface inwardly recessed from said U-shaped first planar surface at a substantially right angle thereto and being extended between said U-shaped first planar surface and said ring-like second planar surface, said first and second chambers being inwardly recessed from said ring-like second planar surface; and wherein said U-shaped first planar surfaces of said first and second heat sink housing members are in aligned abutting contact with each other in said abutting relationship, and wherein said enclosure encloses said second and third regions of said substrate between said transition surfaces of said first and second heat sink housing members and between said ring-like second planar surfaces of said first and second heat sink housing members.

* * * * *